United States Patent [19]
Rossi et al.

[11] Patent Number: 6,154,163
[45] Date of Patent: Nov. 28, 2000

[54] SUCCESSIVE APPROXIMATION SHIFT REGISTER WITH REDUCED LATENCY

[75] Inventors: Annamaria Rossi, Agrate Brianza; Giona Fucili, Milan; Marcello Leone, Rho; Maurizio Nessi, Como, all of Italy

[73] Assignee: SGS-Thomson Microelectronics S.r.l., Agrate Brianza, Italy

[21] Appl. No.: 09/108,080

[22] Filed: Jun. 29, 1998

[30] Foreign Application Priority Data

Jun. 30, 1997 [EP] European Pat. Off. .............. 97830326

[51] Int. Cl.⁷ .................................................. H03M 1/38
[52] U.S. Cl. ............................................. 341/161; 341/155
[58] Field of Search .................... 341/161, 122, 341/165, 164, 163

[56] References Cited

U.S. PATENT DOCUMENTS 4,940,981 7/1990 Naylor et al. ........................... 341/161
5,859,608 1/1999 Fucili et al. ............................. 341/165

FOREIGN PATENT DOCUMENTS 0766 405 A1 4/1997 European Pat. Off. .
2160729A 12/1985 United Kingdom .

*Primary Examiner*—Brian Young
*Attorney, Agent, or Firm*—Jenkens & Gilchrist, P.C.; Theodore E. Galanthay

[57] ABSTRACT

A successive approximation register has a serial input and output comprises a chain of logic circuits of the bistable type which have selectable input terminals feedback connected by a storage and control element and logic gate circuits of the OR-type, and connected to a serial line through respective internal switches communicating the serial line to input terminals of the logic circuits in said chain, the serial line forming an input to a flip-flop of the D type which is the output element of the register.

17 Claims, 5 Drawing Sheets

SUCCESSIVE APPROXIMATION SHIFT REGISTER WITH REDUCED LATENCY

FIELD OF THE INVENTION

This invention relates to analog-to-digital converters (A/D converters) and, in particular, to A/D converters operated as successive approximation (S/A) converters.

BACKGROUND OF THE INVENTION

A/D converters are essential elements to many integrated circuit applications, such as automatic control, data acquisition, and data processing systems, wherein they provide interfaces for converting real-word parameters to digital data adapted for processing by logic circuits, memories, and microprocessors. A/D converters of the successive approximation type are generally preferred, because they combine good speed of execution (200 to 500 ns per bit) with low cost, ease of manufacture (single-chip LST), and good accuracy, and can operate with up to 12 bits in current implementations.

A/D converters of the successive approximation type are included in the line catalogs of all leading manufacturers of semiconductor products. The architecture of a successive approximation A/D converter usually includes a comparator, a digital-to-analog (D/A) converter, and control logics, as shown in FIG. 1. This logic is often referred to as Successive Approximation Register (SAR). A SAR functions to determine the value of each bit in a sequential manner according to the comparator output. A SAR initiates the conversion cycle by putting the most significant bit (MSB) of a word equal to 1 and all the other bits to 0 (trial). This digital word is applied to the D/A converter, which will generate an analog signal whose value is one half the conversion range, Vref/2, and which is compared with the input Vin. If the comparator output is high, then the control logics will set the MSB at 1, or at 0 (decision) if the output is low. At this point the value of the MSB has been determined. The approximation process is continued with the application of a digital word to the D/A converter with an MSB having its exact value and the second trial bit at 1, and all of the remaining bits at zero. The D/A output is again compared with the input: if the comparator output is high, the second bit is set at 1, otherwise at 0, and so on to the least significant bit, LSB, of the word. The contents of the successive approximation register reflect the digital result of the conversion performed.

A SAR is a sequential finite state machine (MSF) which generates the sequence of states shown in the following table (where, for simplicity, the instance of a number N=8 of bits is assumed). Consider the evolution of the sequence in the table: step 1 forces the initialization configuration. Throughout the following steps, three actions are possible on the individual bit: forcing the trial 1, result of the decision from the comparator, storing the previous value.

| Conversion step | D/A input word | | | | | | | | Comparative output |
|---|---|---|---|---|---|---|---|---|---|
| 0 | 1 | 0 | 0 | 0 | 0 | 0 | 0 | 0 | $a_7$ |
| 1 | $a_7$ | 1 | 0 | 0 | 0 | 0 | 0 | 0 | $a_6$ |
| 2 | $a_7$ | $a_6$ | 1 | 0 | 0 | 0 | 0 | 0 | $a_5$ |
| 3 | $a_7$ | $a_6$ | $a_5$ | 1 | 0 | 0 | 0 | 0 | $a_4$ |
| 4 | $a_7$ | $a_6$ | $a_5$ | $a_4$ | 1 | 0 | 0 | 0 | $a_3$ |
| 5 | $a_7$ | $a_6$ | $a_5$ | $a_4$ | $a_3$ | 1 | 0 | 0 | $a_2$ |
| 6 | $a_7$ | $a_6$ | $a_5$ | $a_4$ | $a_3$ | $a_2$ | 1 | 0 | $a_1$ |
| 7 | $a_7$ | $a_6$ | $a_5$ | $a_4$ | $a_3$ | $a_2$ | $a_1$ | 0 | $a_0$ |
| result | $a_7$ | $a_6$ | $a_5$ | $a_4$ | $a_3$ | $a_2$ | $a_1$ | $a_0$ | — |

The successive approximation algorithm by which the table can be described is the following: taking a conversion step whichever, the value at the next step for each bit k of the word input to the D/A converter can be the value of:

- the bit on the left (k+1), if all the bits of lower significance (k−1, k−2, . . . , 0) than this bit, and the bit itself, have a value of "0";
- the comparator output, if this is "1" and all the least significant bits thereof have a value of "0";
- the bit itself, if at least one of the least significant bits has a value of "1".

By implementing this algorithm through a suitable logic network, the same storage elements (flip-flops) that hold the result of the conversion can be used to encode the 2N possible states of the finite state machine MSF.

An n-bit SAR usually has a serial input (comparator output) and an n-bit parallel output (result of the A/D conversion), as shown in FIG. 1.

Certain applications of A/D converters require a serial I/O (input/output) configuration, e.g., for specific serial data exchange standards providing an interface which can be easily serviced by certain processor families. Thus, to obtain a serial output, a parallel input/serial output (PISO) shift register is usually employed which takes n clock periods to shift the result of an n-bit A/D conversion. This use of the A/D converter involves two registers (SAR and PISO) and requires 2n clock periods (n clock periods to obtaining the result of the successive approximation conversion, and n clock periods, called result "latency", for outputting the result).

The underlying technical problem of this invention is to provide a SAR which can handle a serial data output directly, without any additional registers. In particular, a low latency for the result outputting (a single clock period) is sought. This problem is solved by a shift register as previously indicated and further described below.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

SUMMARY OF THE INVENTION

A successive approximation register has a serial input and output comprises a chain of logic circuits of the bistable type which have selectable input terminals feedback connected by a storage and control element and logic gate circuits of the OR-type, and connected to a serial line through respective internal switches communicating the serial line to input terminals of the logic circuits in said chain, the serial line forming an input to a flip-flop of the D type which is the output element of the register.

The features and advantages of a shift register according to the invention will be apparent from the following description of an embodiment thereof, given by way of non-limitative example with reference to the accompanying drawings.

DETAILED DESCRIPTION OF A PREFERRED EMBODIMENT OF THE INVENTION

Figure 1:
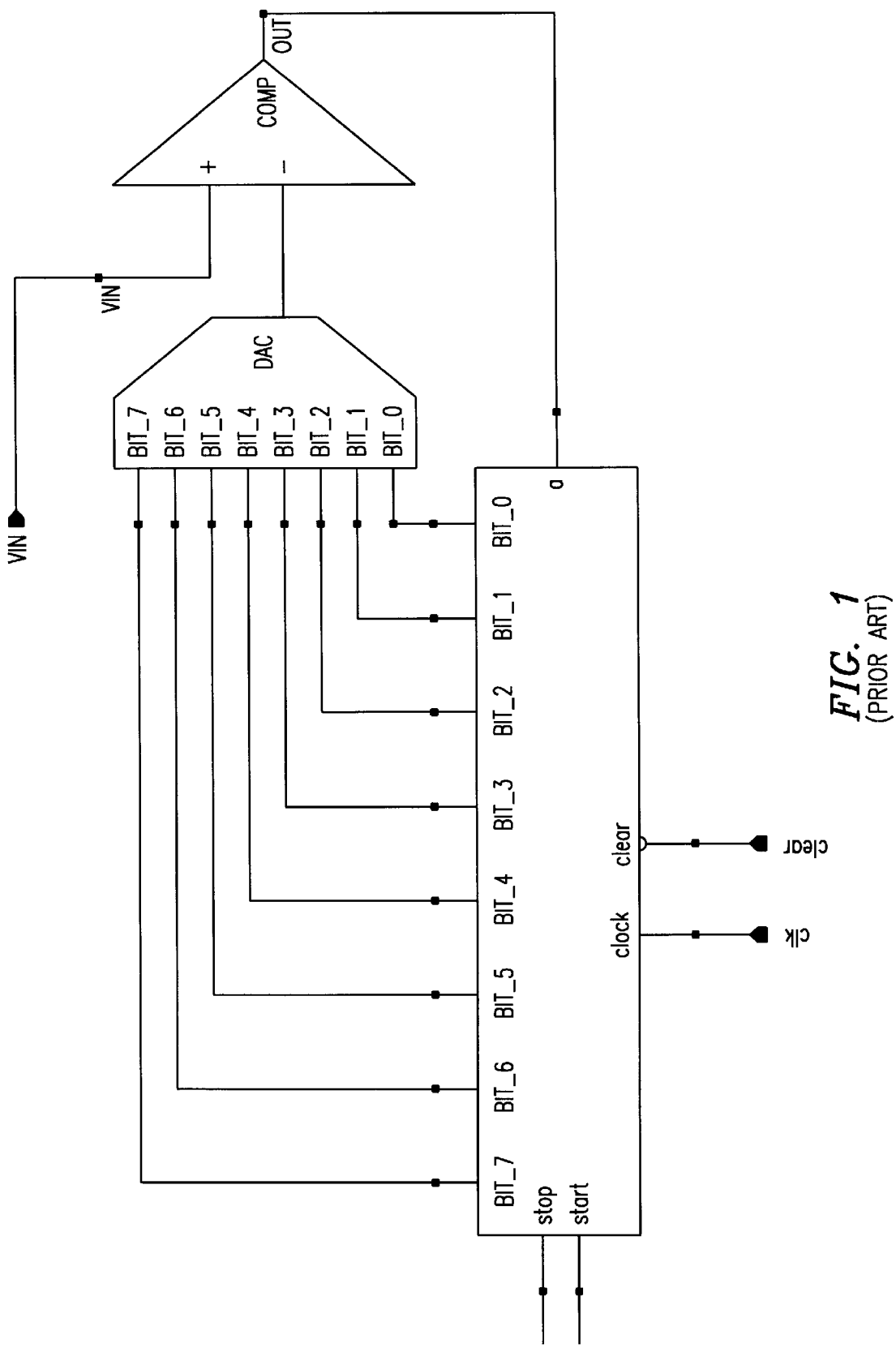
FIG. 1 shows a schematic diagram of a prior art successive approximation analog-to-digital converter.
Figure 2:
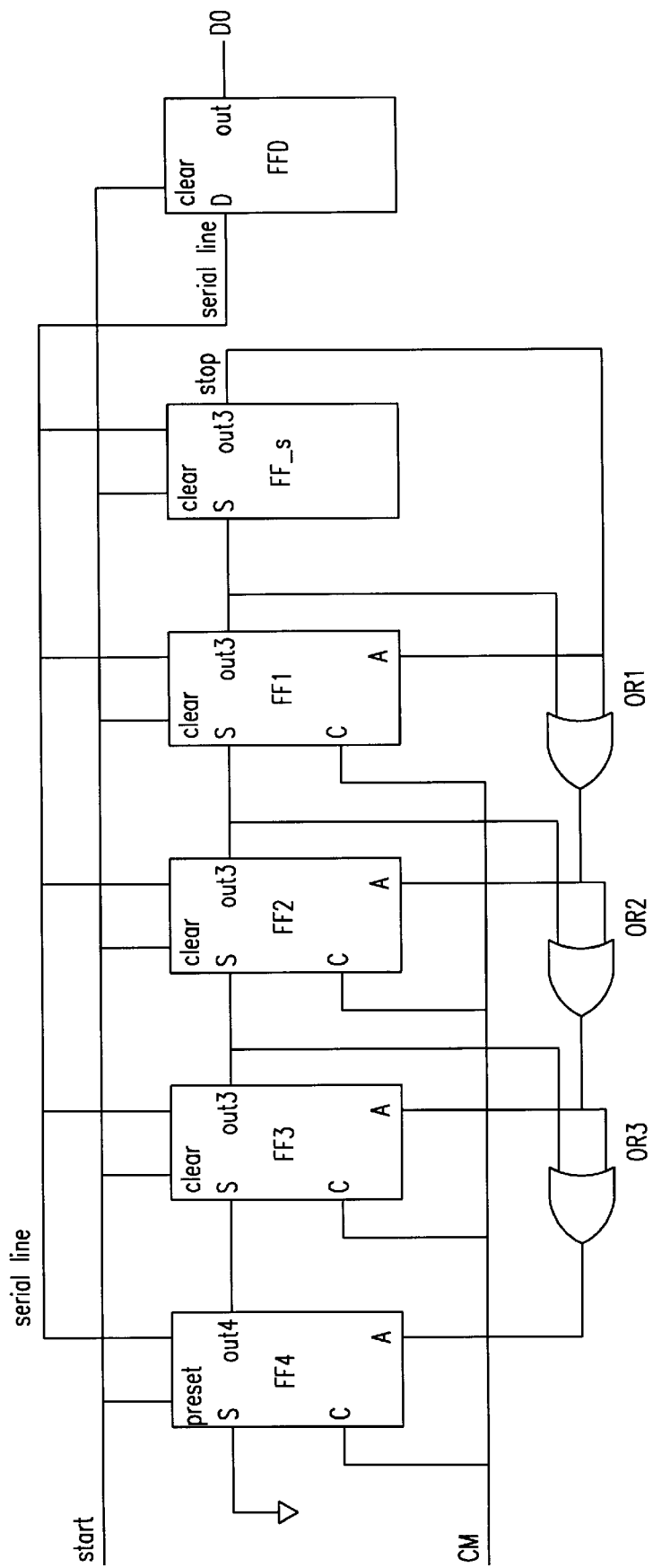
FIG. 2 shows a diagram of a sequential logic network for implementing a successive approximation shift register with serial input and output, according to the present invention.

A successive approximation shift register according to the invention, included in a finite state logic network of the sequential type, has at least first input terminal, START, and second input terminal CM, and an output terminal DO, with a plurality of intervening bistable logic circuits FF as shown in FIG. 2. Logic circuits FF each have first S and second C input terminals, first OUT and second output terminals, a synchronization terminal CLOCK, not shown for simplicity, an initial state preset terminal CLEAR, and a selection terminal A.

The register further includes a storage and control element, FF-s, having an input terminal S, an initial state preset terminal CLEAR, a synchronization terminal CLOCK, not shown, and first STOP and second output terminals. The preset terminals CLEAR of the logic circuits FF and the storage and control element FF-s are connected to the first input terminal START of the register; the second input terminals C of the logic circuits are connected to the second input terminal CM of the register.

According to the invention, the first input terminal S of a first, FF4, of said plurality of logic circuits is connected to a ground, and the other logic circuits FF3, FF2, FF1 are connected between the first output terminal OUT4 of the first logic circuit FF4 and the input terminal S of the storage and control element FF-s, being connected in series through their respective input terminals S, and first output terminals OUT3, OUT2, OUT1.

The second output terminals of the logic circuits FF and the storage and control element FF-s are connected to a serial data transmission line for data coupled to the output terminal DO of the register, and the register further includes logic gates OR1, OR2, OR3, each having first and second input terminals and an output terminal, connected in series with one another through their respective first terminals and output terminals, between the first output terminal STOP of the storage and control element FF-s and the selection terminal A of the first, FF4, of the plurality of logic circuits.

They each have their second input terminal connected to the first output terminal of a respective one of the logic circuits FF3, FF2, FF1 in series with the first, and the first output terminal STOP of the storage and control element is connected to the selection terminal A of the logic circuit FF1, which has its first output terminal connected directly to said element.

The output terminals of the logic gates are respectively connected to the selection terminals A of the other logic circuits FF4, FF3, FF2.

The logic gates included in the register are of the OR-type.

Figure 3:
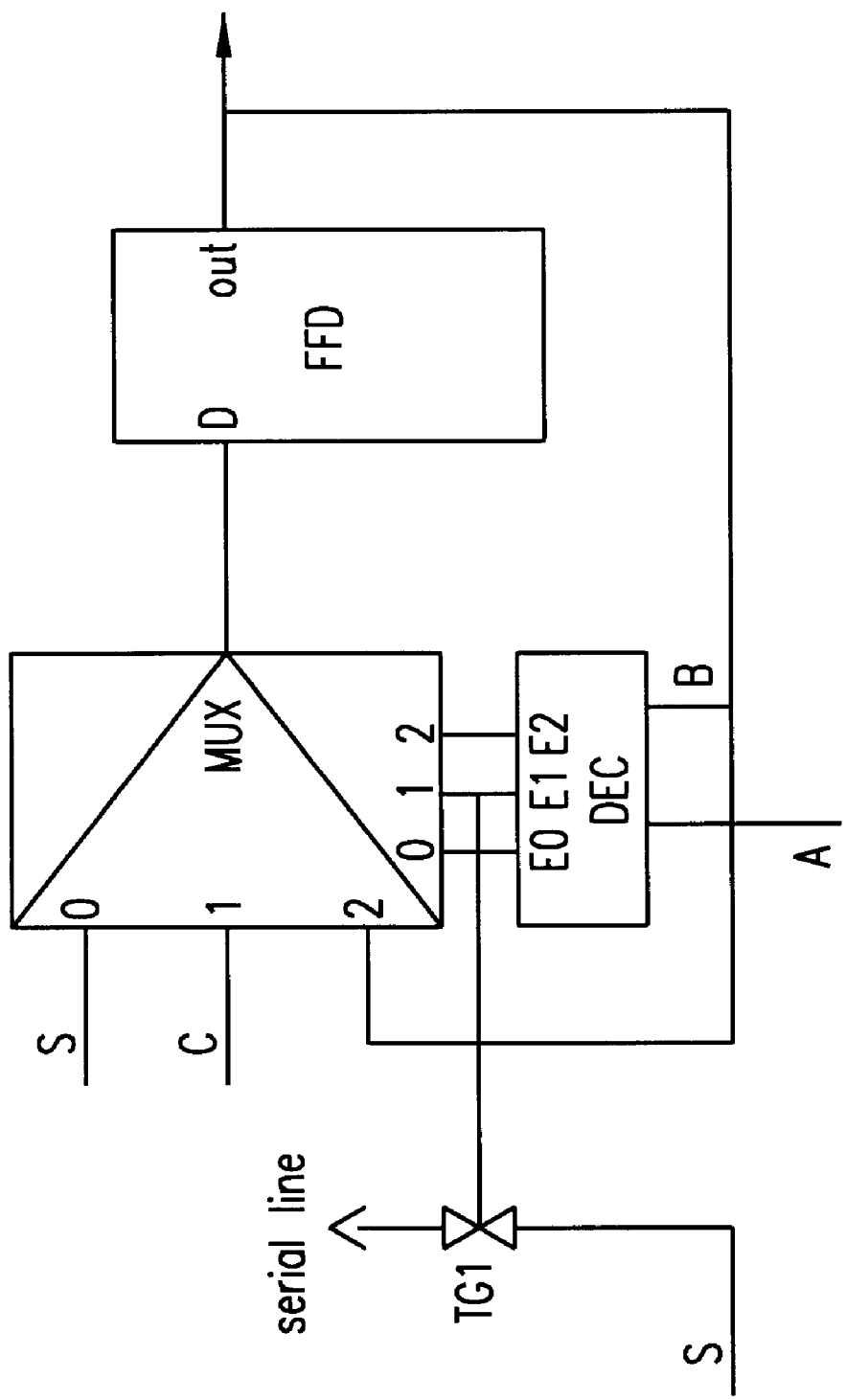
FIGS. 3 and 4 show block diagrams of the basic elements for a shift register according to the present invention.

As shown in FIG. 3, each of the bistable logic circuits FF comprises a flip-flop FFD having an input terminal D, an output terminal OUT which is the output terminal of the logic circuit, a selection circuit MUX coupled to the input terminal of the flip-flop through an output terminal, and a decode circuit DEC adapted for driving the selection circuit.

Decode circuit DEC has a first input terminal A, forming the selection terminal of the logic circuit, and a second input terminal B which is connected to the output terminal OUT of the flip-flop FFD.

The selection circuit MUX has first 0, second 1, and third 2 selectable input terminals of which the first, 0, is connected to the first input terminal S of the logic circuit, the second, 1, is connected to the second input terminal C of the logic circuit, and the third, 2, is connected to the output terminal OUT of the flip-flop FFD.

According to the invention, each of the logic circuits has a switch, TG1, connected between the first input terminal S and the second output terminal of decode circuit DEC, the switch being driven to the closed position by the decode circuit DEC when the second input terminal, 1, of the selection circuit MUX is selected.

Figure 4:
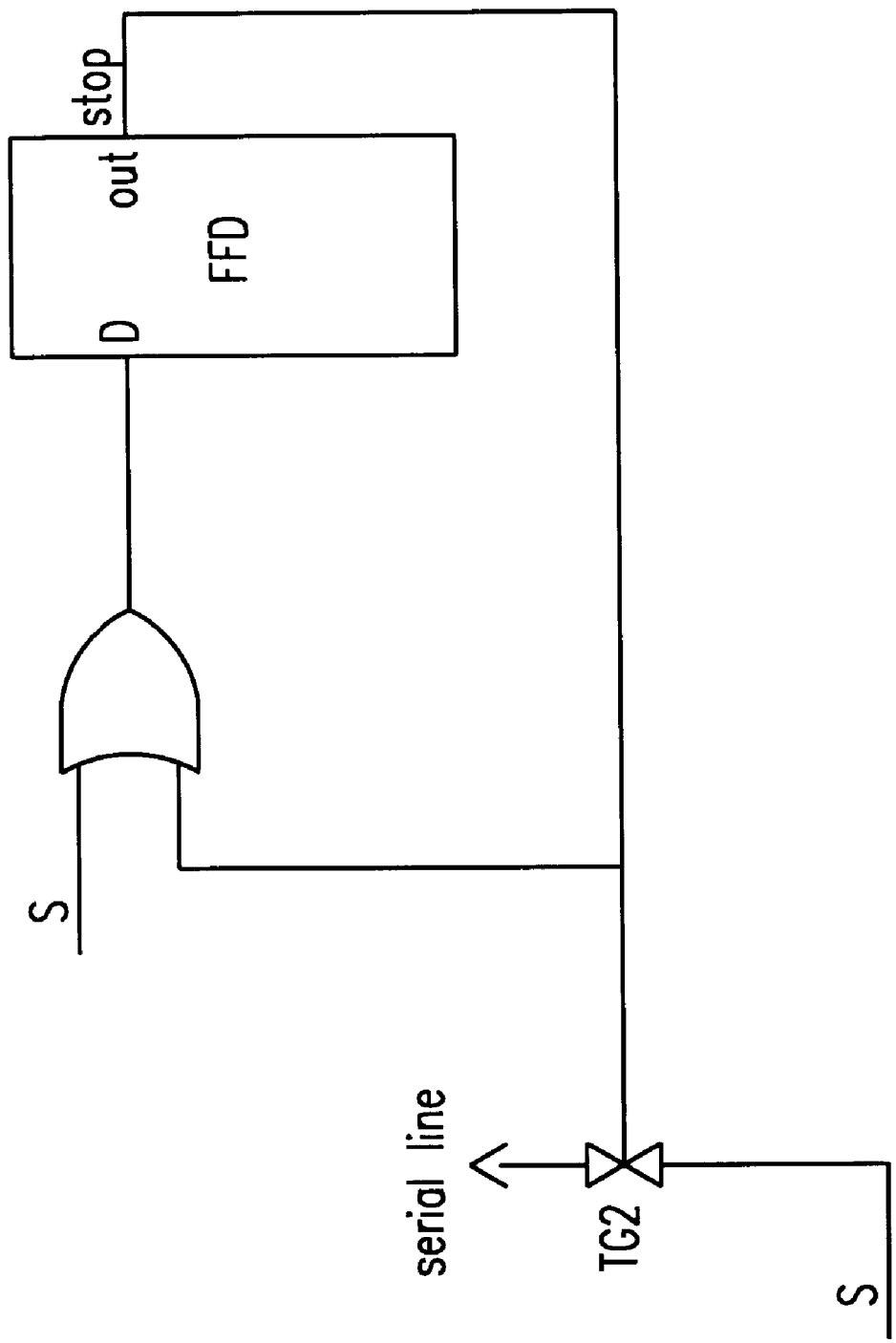

In addition, as shown in FIG. 4, the storage and control element FF-s comprises a flip-flop FFD, having an input terminal D and an output terminal OUT forming the first output terminal, STOP, of the storage and control element, and comprises a logic OR gate having an output terminal connected to the input terminal D of the flip-flop and having first and second input terminals respectively connected to the input terminal S of the storage and control element and the output terminal of the flip-flop.

A switch, TG2, is connected between the input terminal S and the second output terminal of the storage and control element, and is controlled to the closed position from the output terminal of the flip-flop.

The register also includes a flip-flop FFD, connected between the serial line and the output terminal of the register, respectively with an input terminal and an output terminal.

This flip-flop has a preset terminal connected to the second input terminal of the register.

Figure 5:
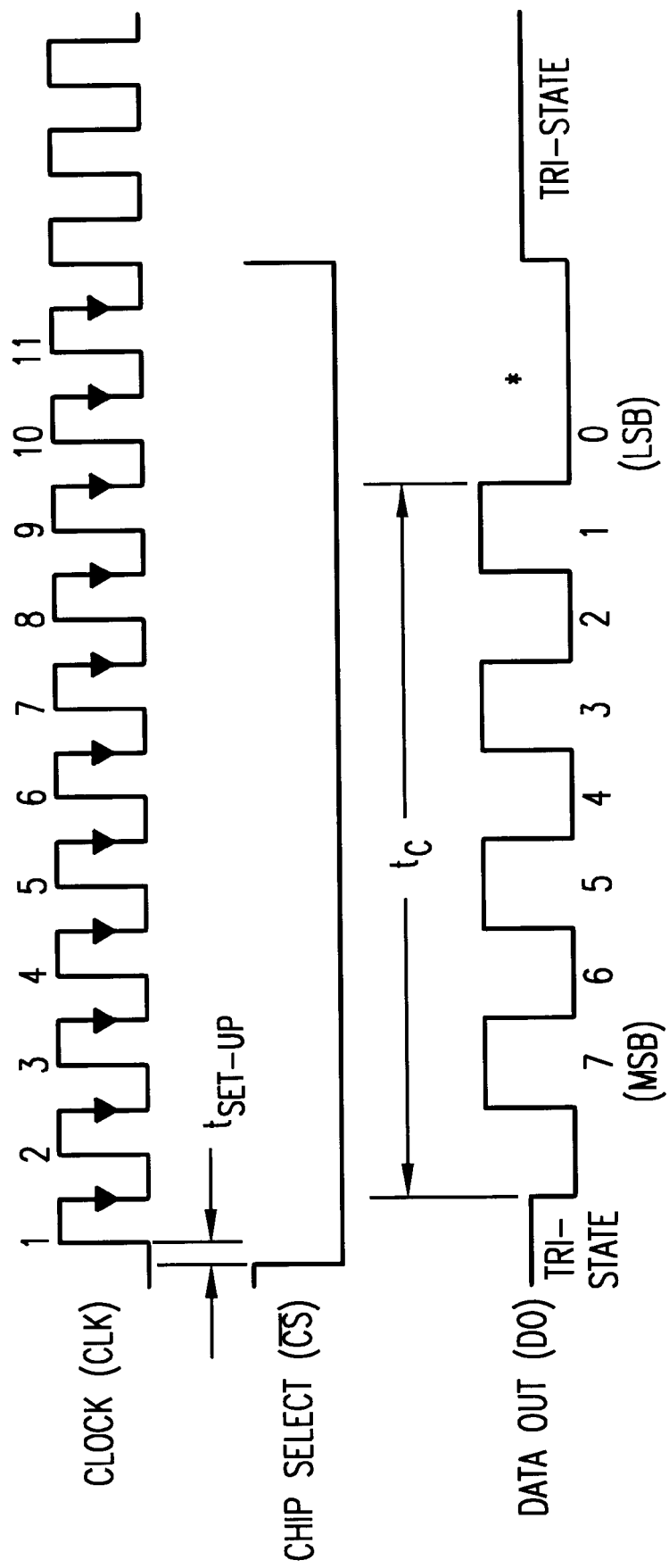
FIG. 5 is a timing diagram for the operation of one embodiment of a register with serial input and output according to the present invention.

The invention is directed to a serial output SAR supplying the result within (n+1) clock periods. In other words, at each successive approximation conversion step, a bit is "decided" which is to be available at the next clock period on the serial output line DO. Assuming that there are n=8 bits, the timing diagram describing the operation is that shown in FIG. 5. With a total of 9 clock periods, the full result is output on the line DO.

Consider now an example of an SAR operation table for n=4 flip-flops FF:

| FF4 | FF3 | FF2 | FF1 | DO |
|-----|-----|-----|-----|------|
| 1   | 0   | 0   | 0   | 0    |
| C   | S   | 0   | 0   | 0    |
| M   | C   | S   | O   | bit4 |
| M   | M   | C   | S   | bit3 |

-continued

| FF4 | FF3 | FF2 | FF1 | DO |
|-----|-----|-----|-----|------|
| M   | M   | M   | C   | bit2 |
| M   | M   | M   | M   | bit1 |

This table shows the values taken sequentially by the serial line DO (0, 0, bits 4, 3, 2, 1); DO takes the value of the output of FF4 when FF3 is at step C. It then takes the output value of FF3 when FF2 is at step C and so on. The flip-flops are arrayed in the left-to-right direction from the MSB to the LSB (FF4=MSB).

For each FF, there are three data inputs taking sequentially the values:

1) shift "1" (step S);
2) comparator output (step C); and
3) stored previous value (step M).

As described hereinabove, the serial line is the input to an FF of the D type, which generates the output DO. All the flip-flops FF of the SAR are connected to that line through an internal switch of each FF communicating the serial line to the output of the preceding FF (S). In the instance of FF4 (more generally, the MSB) the switch will connect DO to ground (S=ground). The signals enabling the switches of FF will produce on DO the sequence shown in the table.

The signal E1 selecting the input (C) to each FF is also connected as an enable signal for the switch of the flip-flop involved. In order to get the bit contained in FF1 (more generally, the LSB) onto the serial line, a flip-flop, referenced FF-s, must be added which utilizes its own output as the switch enable signal (see FIG. 2).

To complete the SAR, the signals which initiate the conversion (START) and the signals which terminate it (STOP) need to be serviced. For a signal START, the asynchronous clear of the flip-flops is used. To store the SAR contents, the signal STOP input to the first OR gate in the chain should be driven high.

This signal is connected to the output of said FF-s. The OR gate contained in FF-s goes to 1 as the output of FF-s goes to 1, so that at the next clock shot the signal STOP will be activated and held active until the next START.

The advantages of a shift register according to the invention can be summarized as follows:

1) a single SAR register comprised of n flip-flops is used (consistency of data);
2) a specific serial I/O (input/output) interface is serviced; and
3) the latency time (n clock periods) of the output data is suppressed.

It should be understood that modifications, integrations, and substitutions of elements may be made unto the embodiment described in the foregoing by way of illustration and not of limitation, without departing from the scope of the following claims.

As an example, the logic OR gates could be replaced with equivalent NAND gates, in conformity with rules known per se.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

We claim:

1. A finite state logic network of the sequential type, the finite state logic network comprising:

a successive approximation shift register having a serial output terminal comprising:

a plurality of register elements, each register element connected to other register elements, including a comparison input terminal and an output terminal and being configurable for selectively storing any of a plurality of data values based upon the state of the successive approximation shift register, the data values including the data value stored in the register element, a data value stored in another register element and a data value corresponding to a signal appearing on the comparison input terminal, each register element comprising a switch element having a first conduction terminal coupled to an output terminal of the another register element and a second conduction terminal;

a serial line connected to the second conduction terminal of the switch element of each register element, the serial line being coupled to the serial output terminal of the successive approximation ADC, a value appearing on the serial output terminal of the successive approximation ADC during an analog-to-digital conversion operation corresponds to a value stored by the register element most recently converted.

2. The finite state logic network of claim 1, wherein each of the register elements comprises a flip-flop having at least one input terminal and an output terminal forming the output terminal of the register element, a selection circuit including a plurality of input terminals and an output terminal coupled to the input terminal of the flip-flop, and a decode circuit having at least one output terminal on which is generated a signal that connects any one of the input terminals of the selection circuit to the input terminal of the flip flop based upon the value of the output signal, the switch element being driven to the closed position by the decode circuit when one of the input terminals of the selection circuit is selected.

3. The finite state logic network of claim 2 further comprising a flip-flop connected between the serial line and the output terminal of the register, and having a preset terminal connected to the second input terminal of the register.

4. A register for a successive approximation analog-to-digital (ADC) converter having a parallel data output word and a serial data output line, comprising:

a plurality of bistable circuits connected together in a chain of bistable circuits, each bistable circuit comprising:

a flip flop circuit having an input and an output providing a bit of the parallel data output word;

a multiplexing circuit having an output coupled to the input of the flip flop circuit and a plurality of inputs for receiving a signal appearing on an output of a flip flop circuit in another bistable circuit, a signal representing a result of a comparison of the parallel data output word to be compared and an analog input to the ADC, and a signal appearing on an output of the flip flop circuit;

a selection circuit connected to the multiplexing circuit for selecting a signal to be applied to the input of the flip flop circuit; and a serial circuit for receiving the output of a flip flop circuit in the another bistable circuit and selectively generating a signal on a serial line output;

wherein the serial line output from each bistable circuit is connected together and coupled to the serial data output line, a signal appearing on the serial data output line during a conversion operation corresponding to a value of the output of the flip flop of the bistable circuit most recently converted.

5. The register of claim 4, wherein:

the serial circuit in each bistable circuit comprises a transmission gate having a first conduction terminal coupled to the output of the flip flop in the another bistable circuit, a second conduction terminal coupled to the serial data output line of the register and a control terminal.

6. The register of claim 5, wherein:

for each bistable circuit, the control terminal of the transmission gate of the serial circuit is coupled to an output of the selection circuit of the bistable circuit.

7. The register of claim 6, wherein:

for each bistable circuit, the control terminal of the transmission gate of the serial circuit is coupled to an output of the selection circuit that enables the selection of the signal representing the result of the comparison of the parallel data output word to be compared and the analog input to the ADC.

8. The register of claim 7, wherein:

for each bistable circuit, the selection circuit receives as an input the output of the flip flop circuit and a feedback connected signal.

9. The register of claim 4, further comprising:

a flip flop circuit having an input coupled to the serial line output from each bistable circuit and an output coupled to the serial data output line.

10. A successive approximation analog-to-digital converter (ADC), comprising:

a digital-to-analog converter (DAC);

a comparator, coupled to the DAC, for comparing an output of the DAC to an analog input signal;

a serial output signal line; and a register, comprising:
a plurality of flip flops, an output of each flip flop providing a bit for a digital word coupled to an input of the DAC, the digital word corresponding to a digital conversion of the analog input signal upon completion of an analog conversion operation; and
serial circuitry for coupling, during the analog conversion operation, an output of the flip flop most recently converted to the serial output signal line.

11. The successive approximation ADC of claim 10, wherein the serial circuitry comprises:

a plurality of transmission gates, each flip flop coupled to a first conduction terminal of a distinct transmission gate, a second conduction terminal of each transmission gate being coupled together to form a serial line, a value appearing on the serial line corresponding to the value of the flip flop most recently converted during the analog conversion operation.

12. The successive approximation ADC of claim 11, wherein the serial circuitry further comprises:

a storage element connected between the serial line and the serial output signal line.

13. A method for converting an analog input signal into a digital signal equivalent, comprising the steps of:

generating an approximation digital signal, the approximation digital signal comprising a plurality of bits and representing a digital approximation of the analog input signal;

converting the approximation digital signal to a converted analog signal;

comparing the converted analog signal to the analog input signal;

determining a value of a bit of the digital signal equivalent based upon the comparison and storing the value in the corresponding bit location in the approximation digital signal; and providing the value of the bit of the digital signal equivalent as a serial output signal substantially immediately following the step of determining and storing.

14. The method of claim 13, further comprising the steps of:

repeating the steps of generating, converting, comparing and providing for each bit in the digital signal equivalent, wherein the value appearing on the serial output signal corresponds to the value of the bit in the digital signal equivalent whose value has been most recently determined.

15. A register for successive approximation analog-to-digital converter (ADC) having a digital-to-analog converter (DAC), a comparator for comparing an output of the DAC to an analog input signal and a serial output signal line, the register comprising:

a plurality of flip flops, an output of each flip flop providing a bit for a digital word coupled to an input of the DAC, the digital word corresponding to a digital conversion of the analog input signal upon completion of an analog conversion operation; and serial circuitry for coupling, during the analog conversion operation, an output of the flip flop most recently converted to the serial output signal line.

16. The register of claim 15, wherein the serial circuitry comprises:

a plurality of transmission gates, each flip flop coupled to a first conduction terminal of a distinct transmission gate, a second conduction terminal of each transmission gate being coupled together to form a serial line, a value appearing on the serial line corresponding to the value of the flip flop most recently converted during the analog conversion operation.

17. The register of claim 15, wherein the serial circuitry further comprises:

a storage element connected between the serial line and the serial output signal line.

* * * * *